(12) United States Patent
Hwang

(10) Patent No.: US 10,611,315 B1
(45) Date of Patent: Apr. 7, 2020

(54) VEHICLE

(71) Applicants: HYUNDAI MOTOR COMPANY, Seoul (KR); KIA MOTORS CORPORATION, Seoul (KR)

(72) Inventor: Yonghwan Hwang, Hwaseong-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 16/208,169

(22) Filed: Dec. 3, 2018

(30) Foreign Application Priority Data

Oct. 8, 2018 (KR) .................. 10-2018-0119509

(51) Int. Cl.
| | |
|---|---|
| *B60R 11/02* | (2006.01) |
| *H04R 1/22* | (2006.01) |
| *H03G 3/32* | (2006.01) |
| *H04R 5/02* | (2006.01) |
| *H04R 5/04* | (2006.01) |
| *B60R 11/00* | (2006.01) |

(52) U.S. Cl.
CPC ............ *B60R 11/0217* (2013.01); *H04R 1/22* (2013.01); *H04R 5/02* (2013.01); *B60R 2011/004* (2013.01); *H03G 3/32* (2013.01); *H04R 5/04* (2013.01); *H04R 2499/13* (2013.01)

(58) Field of Classification Search
CPC . B60R 11/0217; B60R 2011/004; H04R 1/22; H04R 5/02; H04R 5/04; H04R 2499/13; H03G 3/32
See application file for complete search history.

(56) References Cited

U.S. PATENT DOCUMENTS

| 7,885,418 B1* | 2/2011 | Hallman .................. H04R 9/06 181/199 |
| 2016/0311368 A1* | 10/2016 | Lee ........................ B60Q 5/008 |
| 2018/0091891 A1* | 3/2018 | Bullimore .............. H04R 1/227 |

FOREIGN PATENT DOCUMENTS

| CN | 103501041 | * | 1/2014 |
| CN | 204559435 | * | 8/2015 |

* cited by examiner

Primary Examiner — Regina N Holder
(74) Attorney, Agent, or Firm — Brinks Gilson & Lione

(57) ABSTRACT

A vehicle is provided. The vehicle includes a speaker configured to output virtual sound to an outside of the vehicle and convert noise generated from the outside into energy and a battery configured to store the energy converted by the speaker.

17 Claims, 9 Drawing Sheets

VEHICLE

CROSS-REFERENCE TO RELATED APPLICATION

The present application claims priority to and the benefit of Korean Patent Application No. 10-2018-0119509, filed on Oct. 8, 2018, which is incorporated herein by reference in its entirety.

TECHNICAL FIELD

The present disclosure relates to a vehicle for outputting virtual noise to the outside.

BACKGROUND

The statements in this section merely provide background information related to the present disclosure and may not constitute prior art.

Recently, there has been a growing interest on eco-friendly vehicles, such as a hybrid vehicle which runs on the power of an engine and a motor and an electric vehicle and a fuel cell vehicle which run on only the power of a motor.

Since the eco-friendly vehicle runs on only the power of the motor in a turn-off state of the engine that generates noise, or omits the engine, noise of travelling is hardly generated.

Meanwhile, when there is almost no traveling noise, a pedestrian at a surrounding of the vehicle may not recognize the approach of the vehicle, thus safety accidents may occur. In order to remove such limitations, the eco-friendly vehicles are using a virtual engine sound system (VESS) that allows pedestrians to easily recognize the presence and approach of a nearby vehicle by outputting virtual noise to the outside of the vehicle through a speaker.

A typical VESS generates noise through an electronic circuit and outputs the noise through an external speaker of the vehicle such that a nearby pedestrian or the like recognizes the presence of the vehicle.

SUMMARY

Therefore, it is an aspect of the present disclosure to provide a vehicle capable of enhancing the energy efficiency of the vehicle by charging the vehicle with energy from noise of surroundings of the vehicle.

Additional aspects of the disclosure will be set forth in part in the description which follows and, in part, will be obvious from the description, or may be learned by practice of the disclosure.

Therefore, it is an aspect of the present disclosure to provide a vehicle including: a speaker configured to output virtual sound to an outside of the vehicle, and convert noise generated from the outside into energy; and a battery configured to store the energy converted by the speaker.

A travelling speed of the vehicle may be determined, and when the travelling speed is lower than a predetermined reference speed, the speaker may be controlled to output the virtual sound, and when the travelling speed is equal to or higher than the predetermined reference speed, the speaker may be controlled to convert the noise into energy.

The speaker may include: a magnet configured to generate a magnetic flux; a yoke disposed at one side of the magnet to generate a path of the magnetic flux generated from the magnet; a top plate disposed at an other side of the magnet to generate a path of the magnetic flux generated from the magnet; a voice coil disposed in a magnetic gap formed between the yoke and the top plate making a motion; and a diaphragm configured to generate a sound pressure by vibrating according to the motion of the voice coil.

The vehicle may further include an electric power generator connected to opposite ends of the voice coil to generate the energy according to an interaction between the voice coil and the magnet.

The electric power generator may include a resistor connected to the opposite ends of the voice coil.

The vehicle may further include a noise collector surrounding at least a portion of the diaphragm and configured to collect noise generated from the outside through a hole of the noise collector.

The vehicle may further include a noise collector surrounding at least a portion of the speaker and configured to collect noise generated from the outside through a hole of the noise collector.

The noise collector may include a hole former that protrudes outward or inward of the noise collector to form the hole.

The noise collector may include a plurality of the hole formers.

Each of the plurality of hole formers may form a hole having a different area.

Each of the plurality of hole formers may independently protrude outward or inward of the noise collector.

The noise collector may be designed to have a resonance frequency for collecting noise in a frequency band of noise that is generated from the outside of the vehicle.

It is another aspect of the present disclosure to provide a vehicle including: a magnet configured to generate a magnetic flux; a yoke disposed at one side of the magnet to generate a path of the magnetic flux generated from the magnet; a top plate disposed at an other side of the magnet to generate a path of the magnetic flux generated from the magnet; a voice coil disposed in a magnetic gap formed between the yoke and the top plate and making a motion; a diaphragm configured to generate a sound pressure by vibrating according to the motion of the voice coil; and a battery connected to opposite ends of the voice coil to store energy according to an interaction between the voice coil and the magnet.

The vehicle may further include an electric power generator connected to the opposite ends of the voice coil to generate the energy according to an interaction between the voice coil and the magnet.

The electric power generator may include a resistor connected to the opposite ends of the voice coil.

The vehicle may further include a noise collector surrounding at least a portion of the diaphragm and configured to collect noise generated from the outside through a hole of the noise collector.

The noise collector may include a hole former that protrudes outward or inward of the noise collector to form the hole.

The noise collector may include a plurality of the hole formers.

Each of the plurality of hole formers may form a hole having a different area

Each of the plurality of hole formers may independently protrude outward or inward of the noise collector.

Further areas of applicability will become apparent from the description provided herein. It should be understood that the description and specific examples are intended for purposes of illustration only and are not intended to limit the scope of the present disclosure.

DRAWINGS

These and/or other aspects of the disclosure will become apparent and more readily appreciated from the following description of the forms, taken in conjunction with the accompanying drawings of which:

Figure 1:
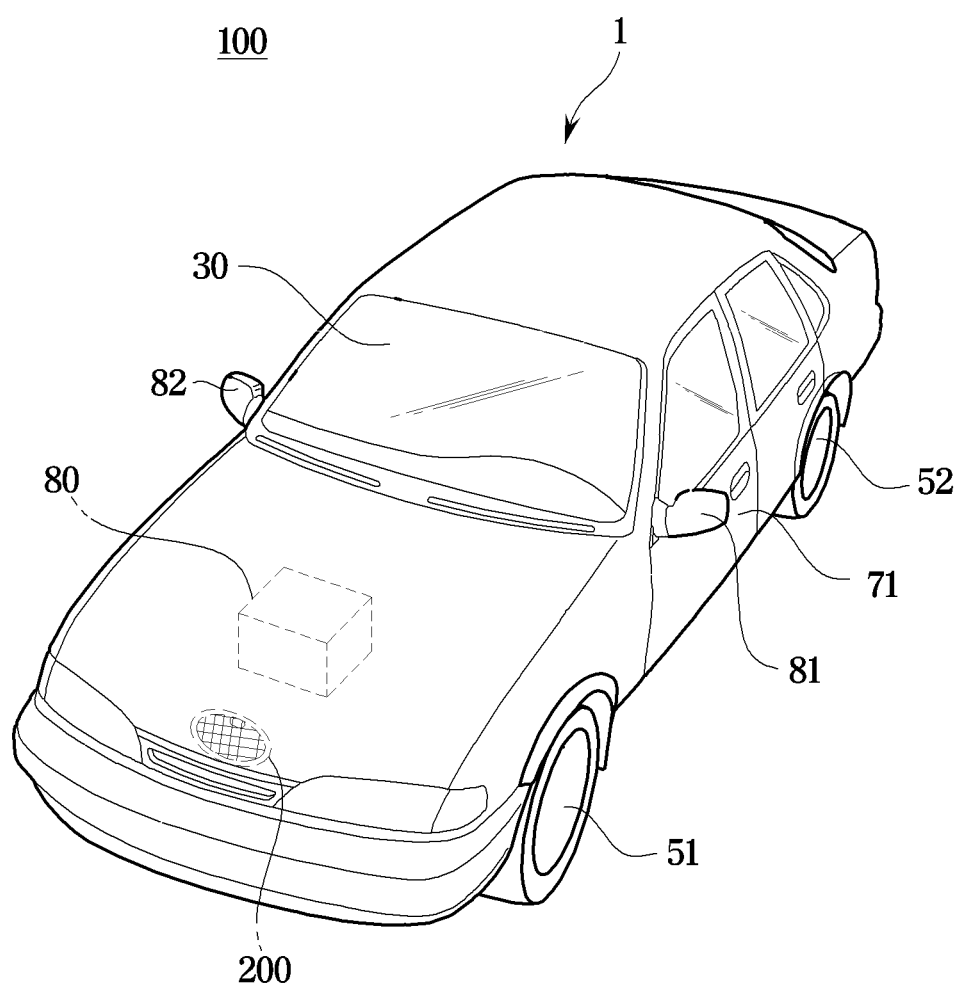
FIG. 1 is an external view illustrating a vehicle in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Like numerals refer to like elements throughout the specification. Not all elements of forms of the present disclosure will be described, and description of what are commonly known in the art or what overlap each other in the forms will be omitted. The terms as used throughout the specification, such as "~ part", "~ module", "~ member", "~ block", etc., may be implemented in software and/or hardware, and a plurality of "~ parts", "~ modules", "~ members", or "~ blocks" may be implemented in a single element, or a single "~ part", "~ module", "~ member", or "~ block" may include a plurality of elements.

It will be further understood that the term "connect" or its derivatives refer both to direct and indirect connection, and the indirect connection includes a connection over a wireless communication network.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless the context clearly indicates otherwise.

Although the terms "first," "second," "A," "B," etc. may be used to describe various components, the terms do not limit the corresponding components, but are used only for the purpose of distinguishing one component from another component.

As used herein, the singular forms "a," "an" and "the" are intended to include the plural forms as well, unless the context clearly indicates otherwise.

Reference numerals used for method steps are just used for convenience of explanation, but not to limit an order of the steps. Thus, unless the context clearly dictates otherwise, the written order may be practiced otherwise.

Hereinafter, the principle and some forms of the present disclosure will be described with reference to the accompanying drawings.

FIG. 1 is an external view illustrating a vehicle 100 in some forms of the present disclosure.

Referring to FIG. 1, a vehicle 100 includes a main body 1 that forms the external appearance of the vehicle 100, a front glass 30 that provides a driver inside the vehicle 100 with a view of the front of the vehicle 100, wheels 51 and 52 that move the vehicle 100, a driving device 60 that rotates the wheels 51 and 52, doors 71 that shield the interior of the vehicle 100 from the outside, and side mirrors 81 and 82 that provide a view of the rear of the vehicle 100, and the vehicle 100 is provided at a front thereof with a vehicle speaker 200 that outputs sound to the outside of the vehicle 100.

The front glass 30 is provided on the front upper side of the main body 100 such that the driver inside the vehicle 100 obtains visual information of the front of the vehicle 100, and is also referred to as windshield glass.

The wheels 51 and 52 include a front wheel 51 provided at the front of the vehicle 100 and a rear wheel 52 provided at the rear of the vehicle 100, and the driving device 80 may provide the front wheel 51 or the rear wheel 52 with a rotational force to move the main body 1 forward or backward. Such a driving device 80 may employ an engine that generates a rotational force by burning fossil fuel or a motor that generates a rotational force by receiving electric power from a capacitor (not shown).

The doors 71 are rotatably provided on the left and right sides of the main body 1 such that the driver may ride in the vehicle 100 when the doors 71 are opened and the interior of the vehicle 100 is shielded from the outside when the doors 71 are closed.

The door 71 may be provided with a window 72 through which the outside of the vehicle is viewed from the inside or the inside of the vehicle is viewed from the outside. In some forms of the present disclosure, the window 72 may be provided to be viewed and opened/closed only from one of the outside and the inside of the vehicle.

The side mirrors 81 and 82 include a left side mirror 81 provided on the left side of the main body 1 and a right side mirror 82 provided on the right side of the main body 1 such that the driver inside the vehicle 100 obtains visual information of the lateral side or the rear side of the vehicle 100.

In addition, the vehicle 100 may include a front camera for acquiring a front view, a left camera or a right camera for acquiring a side view, and a sensing device, such as a proximity sensor for sensing obstacles behind the vehicle or a rain sensor for sensing rainfall and the amount of rainfall.

The vehicle speaker 200 (hereinafter, referred to as a "speaker") for transmitting sound to the outside of the vehicle 100 may be provided at the front of the vehicle 100, and the speaker 200 may be provided at the outside or inside of the main body 1 in a form capable of outputting sound to the outside, for example, the speaker 200 may be installed on the vehicle 100 such that sound is transmitted through a grill formed at the front of the main body 1.

Although only a single speaker 200 is illustrated in FIG. 1, the speaker 20 may be provided at the left side and right side of the main body 1 to transmit sound from the left side and the right side of the vehicle 100, or the speakers 200 may be provided in three or more units thereof.

In addition, the vehicle 100 may further include a controller (not shown) for controlling each component of the vehicle 100.

The controller may be implemented as an electronic control unit (ECU) that controls driving of a power generating device, a power transmitting device, a traveling device, a steering device, a braking device, a suspension device, a transmission device, a fuel device, various safety devices, and various sensors.

The controller may include a main memory that stores data regarding an algorithm for controlling the operations of the components or a program for representing the algorithm, and a main processor that performs the above described operations using the data stored in the main memory. In this case, the main memory and the main processor may be implemented as separate chips, or as a single chip.

The controller in some forms of the present disclosure may determine the traveling speed of the vehicle 100 and control the speaker 200 to output previously stored virtual sound such that pedestrians easily recognize the presence or approach f a nearby vehicle when the traveling speed is less than a predetermined reference speed. To this end, the controller may be implemented using a virtual engine sound system (VESS).

In addition, when the traveling speed is equal to or higher than the reference speed, the controller may control the speaker 200 to collect noise of the outside of the vehicle 100. The controller may determine the traveling speed of the vehicle 100 by receiving a result of speed sensing from a speed sensing sensor provided in the vehicle 100.

The speaker 200 for collecting external noise will be further described below.

Figure 2:
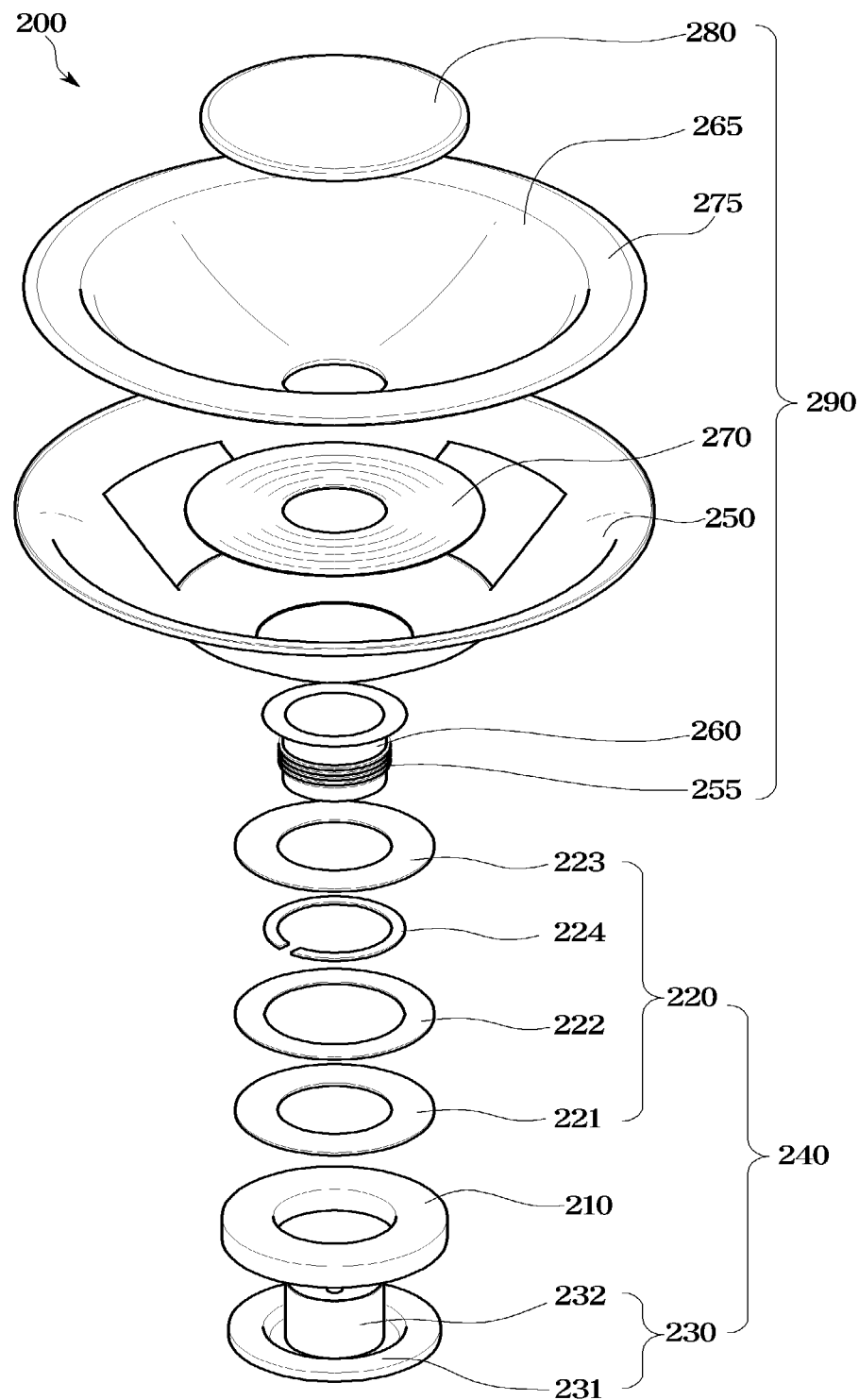
FIG. 2 is an exploded perspective view illustrating a speaker for a vehicle in one form of the present disclosure.
Figure 3:
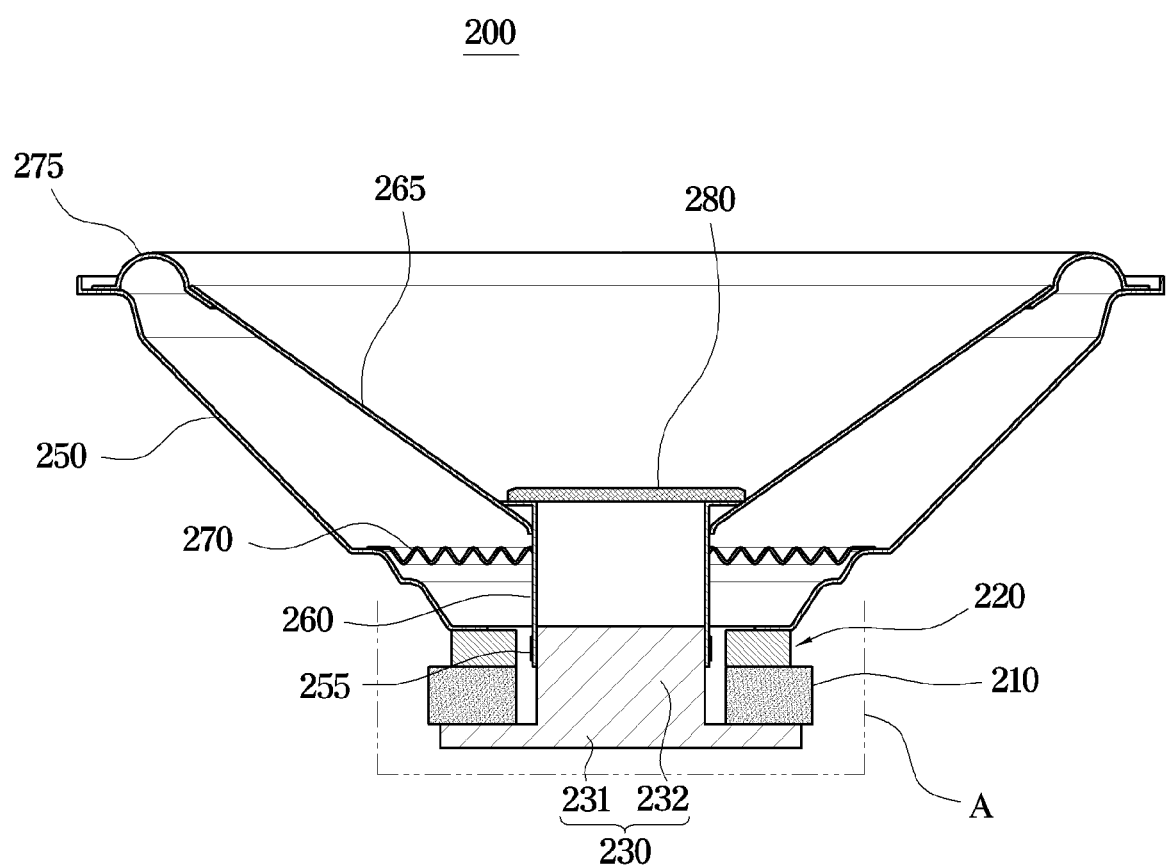
FIG. 3 is a cross-sectional view illustrating a speaker in one form of the present disclosure.
Figure 4:
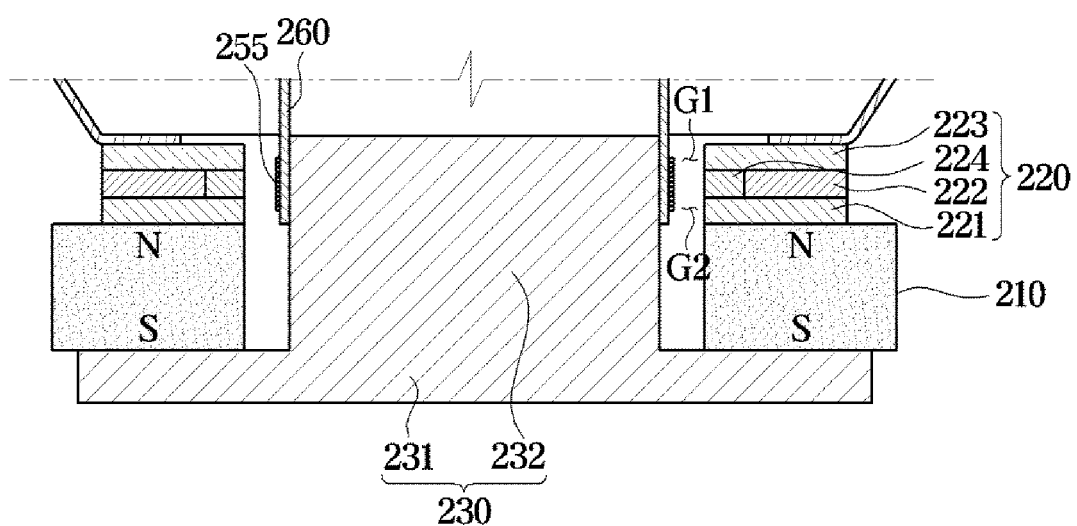
FIG. 4 is an enlarged view illustrating portion A shown in FIG. 3.

FIG. 2 is an exploded perspective view illustrating a speaker for a vehicle in some forms of the present disclosure, FIG. 3 is a cross-sectional view illustrating a speaker in some forms of the present disclosure, and FIG. 4 is an enlarged view illustrating portion A shown in FIG. 3.

Referring to FIGS. 2 to 4, the speaker 200 may have a magnetic circuit 240 and a vibration system 290.

The magnetic circuit 240 may include a magnet 210 for generating a magnetic flux, a top plate 220 for forming a path of the magnetic flux generated by the magnet 210, and a yoke 230 for supporting the magnet 210.

The magnet 210 may have an N pole and an S pole, and may be magnetized in a direction from the front to the rear of the vehicle speaker 200. Hereinafter, the front of the speaker 200 represents a position toward which sound waves travel, i.e., the upper side of FIG. 3, and the rear of the speaker 200 represents a position opposite to the front. Details of the magnet 210 will be further described in a related part below.

The top plate 220 may be disposed radially outward of a pole piece 232 of the yoke 230. In more detail, the top plate 220 may be disposed on the upper side of the magnet 210 to form a path of the magnetic flux generated in the magnet 210. In some forms of the present disclosure, the top plate 220 may include a first magnetic plate 221, a spacer plate 222 stacked in front of the first magnetic plate 221, a second magnetic plate 223 stacked in front of the spacer plate 222, and a short ring 224 inserted into an empty space formed by the first magnetic plate 221, the spacer plate 222, and the second magnetic plate 223.

The first magnetic plate 221, the spacer plate 222, and the second magnetic plate 223 may be formed of a magnetic material having a low magnetic resistance, for example, steel, alloys or other magnetic material. The first magnetic plate 221, the spacer plate 222, and the second magnetic plate 223 may be separately provided and coupled to each other. The first magnetic plate 221, the spacer plate 222, and the second magnetic plate 223 may be coupled to each other through an adhesive member or a fastening member, such as a screw. Since the first magnetic plate 221, the spacer plate 222, and the second magnetic plate 223 are separately provided and coupled to each other, the assembly of the short ring 224 may be facilitated.

The first magnetic plate 221 may be stacked in front of the magnet 210. The first magnetic plate 221 may be provided approximately in a ring shape having a hollowness, and the pole piece 232 of the yoke 230 may be inserted into the hollowness. The first magnetic plate 221 may be formed flat to have a constant thickness.

The second magnetic plate 223 may be provided approximately in a ring shape having a hollowness, and the pole piece 232 of the yoke 230 may be inserted into the hollowness. The second magnetic plate 223 may be formed flat to have a constant thickness.

The first magnetic plate 221 and the second magnetic plate 223 may have the same thickness. The thickness of the first magnetic plate 221 and the thickness of the second magnetic plate 223 are set to be the same as each other, so that the voice coil 255 makes a linear motion.

The spacer plate 222 may be provided between the first magnetic plate 221 and the second magnetic plate 223 such that the first magnetic plate 221 and the second magnetic plate 223 are spaced apart from each other. The spacer plate 222 may be provided approximately in a ring shape having a hollowness, and the pole piece 232 of the yoke 230 may be inserted into the hollowness. The spacer plate 222 may be formed flat to have a constant thickness.

The first magnetic plate 221 and the second magnetic plate 223 may be formed closer to the pole piece 232 than the spacer plate 222. Accordingly, an empty space may be formed between a front surface of the first magnetic plate 221, a rear surface of the second magnetic plate 223, and an inner surface of the spacer plate 222. The short ring 224 may be inserted into the empty space.

The short ring 224 is formed of a material having a magnetic permeability lower than that of the first magnetic plate 221 and the second magnetic plate 223 such that the magnetic flux concentrates on the first magnetic plate 221 and the second magnetic plate 223. In addition, the short ring 224 comes into close contact with the first magnetic plate 221 and the second magnetic plate 223 to firmly support the first magnetic plate 221 and the second magnetic plate 223. The short ring 224 may take a form of a closed ring or an open ring.

The yoke 230 may include a back plate 231 provided behind the magnet 210 to support the magnet 210 and the pole piece 232 protruding forward from a central portion of the back plate 231. With the configuration, the yoke 230 has a first magnetic gap G1 formed between the first magnetic plate 221 and the pole piece 232 and a second magnetic gap G2 formed between the second magnetic plate 223 and the pole piece 232.

With the configuration, some of magnetic force lines starting from the N pole of the magnet 210 pass through the first magnetic plate 221, the first magnetic gap G1, the pole piece 232, and the back plate 231, and finally reaches the S pole of the magnet 210. The remaining of the magnetic force lines pass through the second magnetic plate 223, the second magnetic gap G2, the pole piece 232, the back plate 231, and the magnet 210, and reaches the S pole of the magnet 210.

Since the first magnetic gap G1 and the second magnetic gap G2 are arranged at a predetermined interval in the front and rear directions, the length of motion of the voice coil 255 may be increased and the leakage flux may be reduced.

The vibration system 290 includes a frame 250, a voice coil 255 disposed in the first magnetic gap G1 and the second magnetic gap G2 to make a forward and backward motion while interacting with the magnetic flux in the first magnetic gap G1 and the second magnetic gap G2 when an electric current is applied to the voice coil 255, a bobbin 260 around which the voice coil 255 is wound, a diaphragm 265 that generates a sound pressure by vibrating in accordance with the motion of the voice coil 255, a damper 270 that guides the forward and backward motion of the voice coil 255 and restraining the leftward and rightward motion of the voice coil 255, an edge 275 that couples an outer rim of the diaphragm 265 to the frame 250, and a dust cap 280 configured to prevent foreign substance from penetrating into the first magnetic gap G1 and the second magnetic gap G2.

The frame 250 may form the external appearance of the speaker 200. According to an example, the frame 250 may be formed of at least one material selected from the group including polypropylene and twisted glass fiber (TGF) such that the vibration of the vibration system 290 is smoothly performed.

The height of the voice coil 255 may be properly designed such that the voice coil 255 interacts with the magnetic flux in the first magnetic gap G1 and the second magnetic gap G2. For example, the height of the voice coil 255 may be equal to the sum of the thickness of the first magnetic plate 221 and the thickness of the spacer plate 222. Alternatively, the height of the voice coil 255 may be equal to the sum of the thickness of the second magnetic plate 223 and the thickness of the spacer plate 222. Alternatively, the height of the voice coil 255 may be equal to the sum of a half of the thickness of the first magnetic plate 221, a half of the thickness of the second magnetic plate 223, and the thickness of the spacer plate 222. Alternatively, the height of the voice coil 255 may be equal to the sum of the thickness of the first magnetic plate 221, the thickness of the spacer plate 222, and the thickness of the second magnetic plate 223. Alternatively, the thickness of the voice coil 255 may be less than or greater than the sum of the thickness of the first magnetic plate 221, the thickness of the spacer plate 222, and the thickness of the second magnetic plate 223.

The voice coil 255 may be positioned in the middle of the entire section of the top plate 220 when no current is applied to the voice coil 255.

Meanwhile, in the speaker 200 in some forms of the present disclosure, when the diaphragm 265 vibrates due to external noise, the voice coil 255 moves in the front and rear directions according to the vibration of the diaphragm 265.

A resistor (not shown) may be connected to opposite ends of the voice coil 255. An electromagnetic induction phenomenon may occur in the voice coil 255 due to the forward and backward motion of the voice coil 255 and the magnetic field formed by the magnet 210, and an induced electromotive force may be generated in the resistor, and an induction current may flow.

The amount of power generated due to the induced electromotive force and the induction current are expressed by Equation 1.

$$P(W)=VI \qquad \text{[Equation 1]}$$

P is the amount of power, V is the induced electromotive force, and I is the induction current.

In addition to the resistor, various electric power generators for generating an induced electromotive force may be connected to the opposite ends of the voice coil 255. Since the circuit configuration of the electric power generator for generating an induced electromotive force is well known technology, detailed description thereof will be omitted.

The power generated by the electric power generator is charged as energy in a battery (not shown) of the vehicle 100 that supplies driving power by being electrically connected to a terminal device, an audio device, an interior light, a starter motor, and other electronic devices in the vehicle.

The speaker 200 in some forms of the present disclosure may employ a structure capable of effectively collecting external noise in a frequency band of noise generated from the outside of the vehicle 100.

Figure 5:
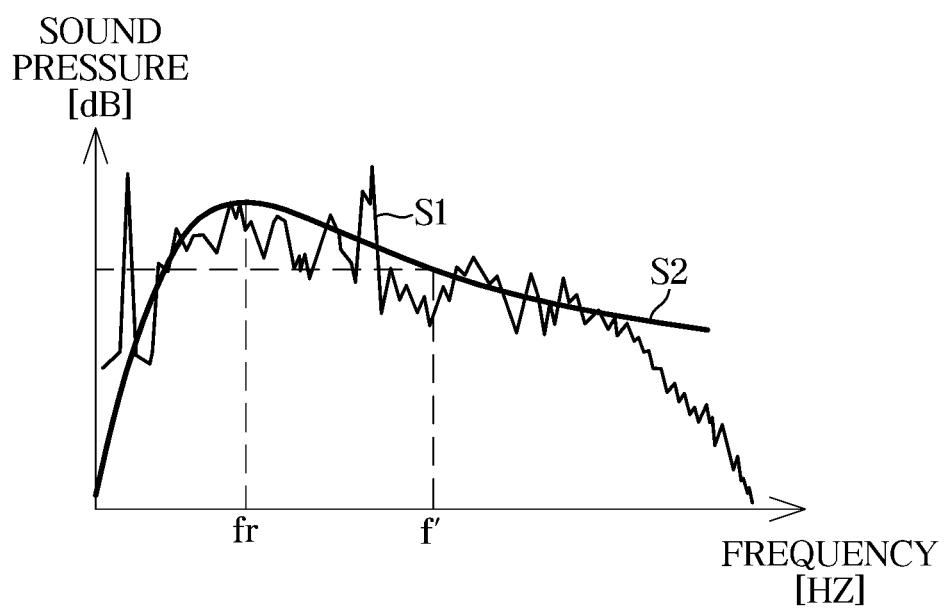
FIG. 5 is a graph showing the level of the sound pressure with increase or decrease of the frequency of the external noise, and the frequency characteristics of the speaker.

FIG. 5 is a graph showing the level of the sound pressure with increase or decrease of the frequency of external noise S1 and the frequency characteristics S2 of the speaker.

In the speaker 200 in some forms of the present disclosure, the mass of the diaphragm 265, the dust cap 280, and the voice coil 255 and the spring constant of the edge 275 may be determined such that the speaker 200 has a resonance frequency for collecting noise in a frequency band of the external noise S1.

Referring to FIG. 5, when the external noise S1 of the vehicle 100 has a frequency band approximately equal to or lower than f' [Hz], the speaker 200 may have a structure or physical properties having a resonance frequency of fr [Hz].

Since the speaker 200 has a resonance frequency of fr [Hz], the voice coil 255 of the speaker 200 maximally vibrates when noise having a frequency band of f' [Hz] or less occurs at a surrounding of the vehicle 100, and an induced electromotive force generated in this case may be maximized.

Accordingly, the power generated by the speaker 200 may be maximized.

Meanwhile, the speaker 200 may employ various structures to have a specific resonance frequency or to effectively collect noise.

Figure 6:
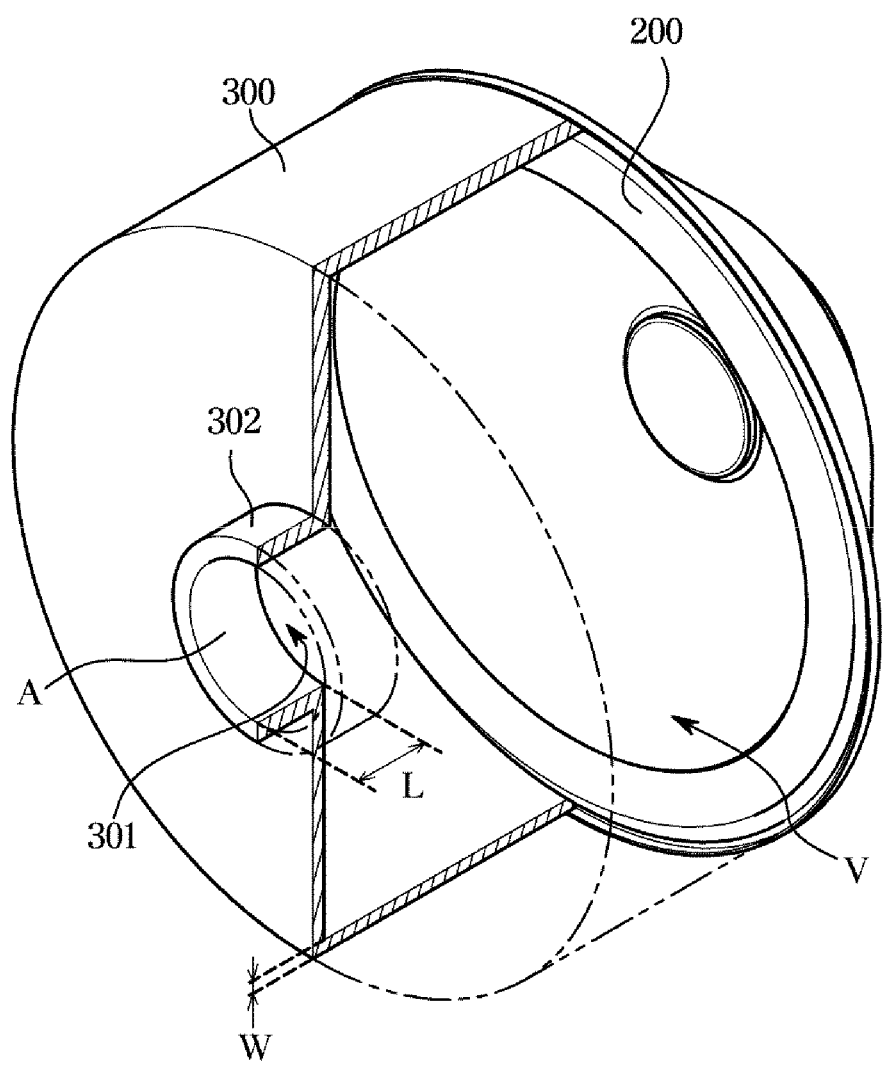
FIGS. 6 to 8 are diagrams illustrating various structures that may be used for the speaker in some forms of the present disclosure.
Figure 7:
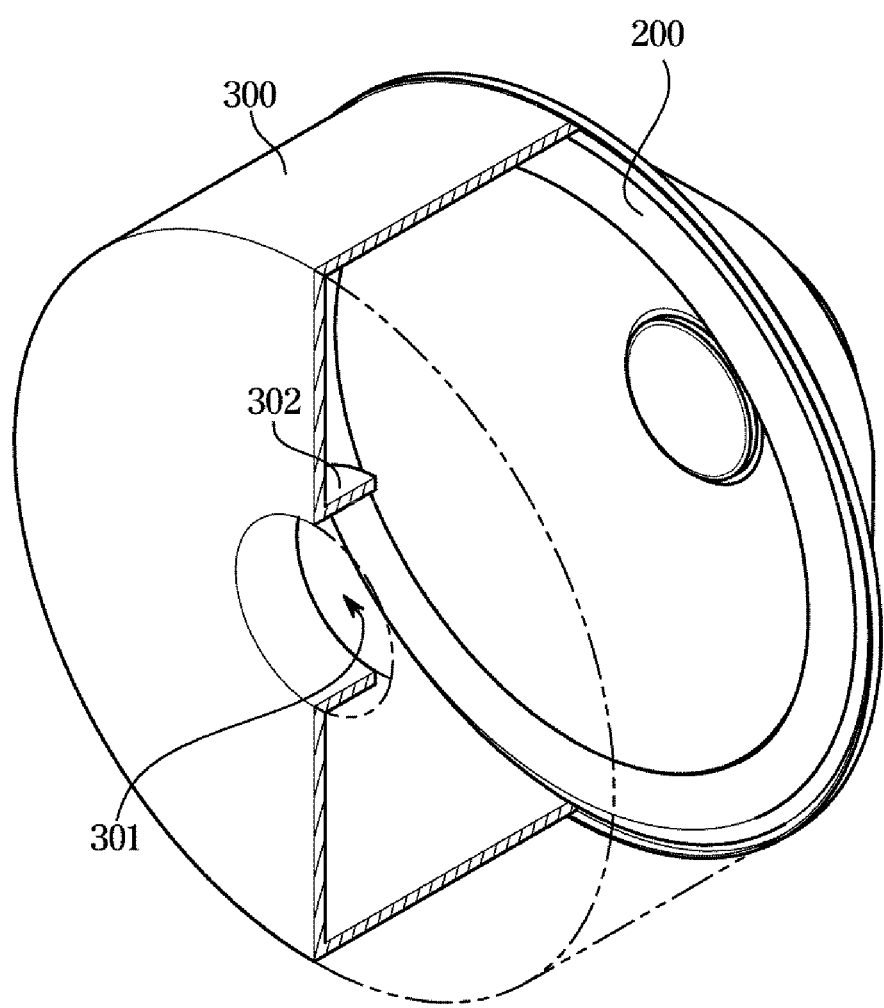
Figure 8:
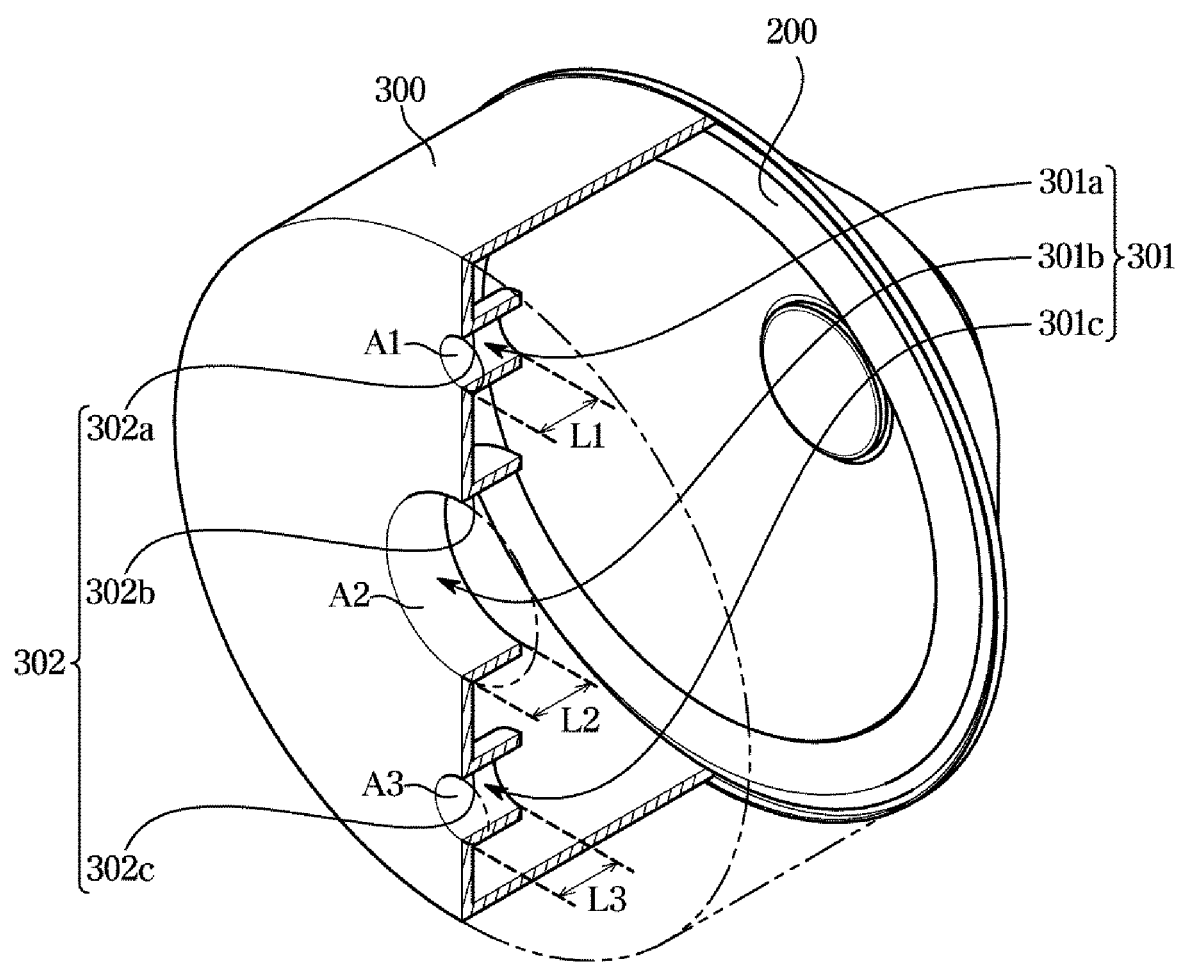

FIGS. 6 to 8 are diagrams illustrating various structures that may be used for the speaker in some forms of the present disclosure.

The speaker 200 may further include a noise collector 300 extending from the outer rim of the frame 250 while surrounding at least a portion of the diaphragm 265 at the front of the speaker 200 and configured to collect noise through a hole 301 of the noise collector 300.

The noise collector 300 may include a hole former 302 that may protrude outward of the noise collector 300 to form the hole 301 as shown in FIG. 6, or may protrude inward of the noise collector 300 to form the hole 301 as shown in FIG. 7.

The hole former 302 may amplify the noise generated from the outside of the noise collector 300 to thereby increase the motion of the voice coil 255.

At least one of the volume V of the noise collector 300, the length L of the hole former 302, and the area A of the hole formed by the hole former 302 may be selected according to the resonance frequency characteristics of the speaker 200.

In addition, at least one of the volume V of the noise collector 300, the length L of the hole former 302, and the area A of the hole formed by the hole former 302 may be variably adjusted in a stage of use.

For example, the noise collector 300 may be implemented such that the height h of the noise collector 300 is extended to increase the volume V of the noise collector 300, the area A of the hole is mechanically expanded or reduced, or the length L of the hole former 302 is also extended.

In addition, the thickness W of the noise collector 300 may also be selected. In addition, a plurality of holes 301a, 301b, and 301c may be formed in the noise collector 300 as shown in FIG. 8. To this end, the noise collector 300 may include a plurality of hole formers 302a, 302b, and 302c, each of which may independently protrude outward of the noise collector 300 as shown in FIG. 6, or may protrude inward of the noise collector 300 as shown in FIG. 7.

Figure 9:
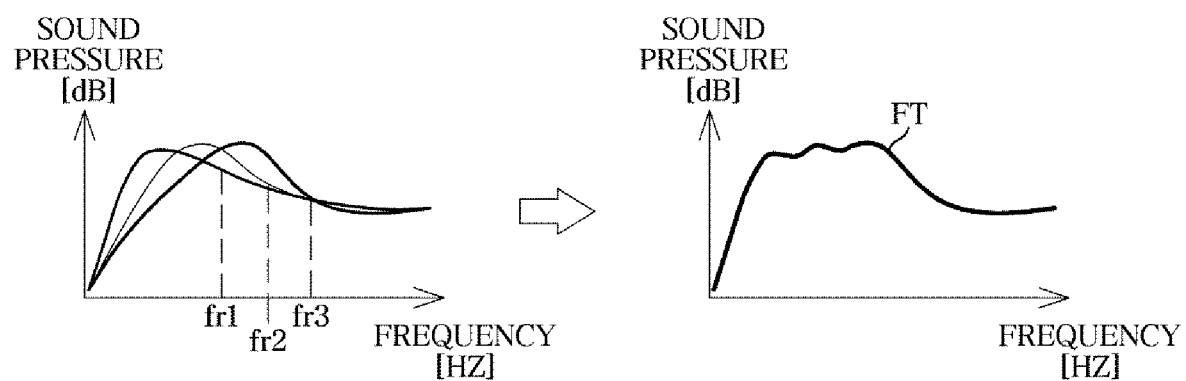
FIG. 9 is a graph showing the frequency characteristics when the structure of the speaker in one form of the present disclosure shown in FIG. 8 is used.

FIG. 9 is a graph showing the frequency characteristics when the structure of the speaker in some forms of the present disclosure shown in FIG. 8 is used.

Referring to FIG. 8, the hole formers 302a, 302b, and 302c may have different lengths L1, L2, and L3, and the holes 301 formed by the hole formers 302a, 302b, and 302c may also have different areas A1, A2, and A3.

Referring to FIG. 9, since the noise collector 300 forms the hole formers 302a, 302b, and 302c having different lengths L1, L2, and L3 and forms the plurality of holes 301 having different areas A1, A2, and A3, the speaker 200 may achieve the effect of having a plurality of resonance frequencies fr1, fr2 and fr3, and broaden the frequency band FT of noise amplifiable by the speaker 200.

The vehicle 100 including the speaker 200 in some forms of the present disclosure controls the speaker 200 to reproduce a virtual engine sound source that is previously stored in the speaker 200 when the travelling speed of the vehicle 100 is less than a reference speed, and connects the above described electric power generator to the speaker 200 in a hardware or software manner and controls an induced the electromotive force generated through the electric power generator to be supplied to the battery, so that the use of the speaker 200 is actively converted.

With regard to the performances of the components of the vehicle 100 described above, at least one component may be added or deleted. In addition, it should be understood by those skilled in the art that the mutual positions of the components may be changed to correspond to the performance and structure of the system.

As is apparent from the above, the vehicle according to the present disclosure can obviate the need to have an energy charging system by charging the vehicle with energy using a speaker that is used for the existing VESS.

The vehicle can generate the energy of the vehicle in an eco-friendly manner by charging the vehicle with the energy using external noise of everyday life.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A vehicle comprising:
   a speaker configured to output virtual sound to an outside of the vehicle, and convert noise generated from the outside of the vehicle into energy; and
   a battery configured to store the energy converted by the speaker; and
   a controller configured to:
      when a travelling speed of the vehicle is lower than a predetermined reference speed, output the virtual sound; and
      when the travelling speed of the vehicle is equal to or higher than the predetermined reference speed, control the speaker to collect the noise and convert the noise into the energy,
   wherein the speaker further comprises a noise collector surrounding at least a portion of the speaker and configured to collect the noise through a hole of the noise collector,
   wherein the noise collector is configured to have a resonance frequency for collecting the noise in a frequency band of the noise.

2. The vehicle of claim 1, wherein the speaker further comprises:
   a magnet configured to generate a magnetic flux;
   a yoke disposed at one side of the magnet and configured to generate a path of the magnetic flux;
   a top plate disposed at another side of the magnet and configured to generate the path of the magnetic flux;
   a voice coil disposed in a magnetic gap formed between the yoke and the top plate and configured to make a motion; and
   a diaphragm configured to generate a sound pressure by vibrating corresponding to a movement of the voice coil.

3. The vehicle of claim 2, wherein the vehicle further comprises:
   an electric power generator connected to opposite ends of the voice coil and configured to generate the energy corresponding to an interaction between the voice coil and the magnet.

4. The vehicle of claim 3, wherein the electric power generator further comprises:
   a resistor connected to the opposite ends of the voice coil.

5. The vehicle of claim 2, wherein the vehicle further comprises:
   a noise collector surrounding at least a portion of the diaphragm and configured to collect the noise through the hole of the noise collector.

6. The vehicle of claim 1, wherein the noise collector comprises:
   a hole former configured to protrude outward or inward of the noise collector to form a hole.

7. The vehicle of claim 6, wherein the noise collector comprises a plurality of hole formers.

8. The vehicle of claim 7, wherein each hole former of the plurality of hole formers is configured to form a hole having a different area.

9. The vehicle of claim 7, wherein the each hole former of the plurality of hole formers is configured to independently protrude outward or inward of the noise collector.

10. A speaker comprising:
   a magnet configured to generate a magnetic flux;
   a yoke disposed at one side of the magnet and configured to generate a path of the magnetic flux;
   a top plate disposed at another side of the magnet and configured to generate the path of the magnetic flux;
   a voice coil disposed in a magnetic gap formed between the yoke and the top plate and configured to make a motion;
   a diaphragm configured to generate a sound pressure by vibrating corresponding to a movement of the voice coil;
   a battery connected to opposite ends of the voice coil and configured to store energy corresponding to an interaction between the voice coil and the magnet; and
   a noise collector surrounding at least a portion of the speaker and configured to collect noise generated from outside of a vehicle through a hole of the noise collector when a traveling speed of the vehicle is equal to or higher than a predetermined reference speed, wherein the noise collector is configured to have a resonance frequency for collecting the noise in a frequency band of the noise.

11. The speaker of claim 10, wherein the speaker further comprises:
an electric power generator connected to the opposite ends of the voice coil and configured to generate the energy corresponding to the interaction between the voice coil and the magnet.

12. The speaker of claim 11, wherein the electric power generator comprises:
a resistor connected to the opposite ends of the voice coil.

13. The speaker of claim 11, wherein the speaker further comprises:
a noise collector surrounding at least a portion of the diaphragm and configured to collect noise generated from outside of the vehicle through the hole of the noise collector.

14. The speaker of claim 13, wherein the noise collector further comprises:
a hole former configured to protrude outward or inward of the noise collector to form a hole.

15. The speaker of claim 13, wherein the noise collector comprises a plurality of hole formers.

16. The speaker of claim 15, wherein each hole former of the plurality of hole formers is configured to form a hole having a different area.

17. The speaker of claim 15, wherein the each hole former of the plurality of hole formers is configured to independently protrude outward or inward of the noise collector.

* * * * *